United States Patent
Sekiguchi

(10) Patent No.: US 8,228,964 B2
(45) Date of Patent: Jul. 24, 2012

(54) SURFACE EMITTING LASER, SURFACE EMITTING LASER ARRAY, AND IMAGE FORMATION APPARATUS

(75) Inventor: Yoshinobu Sekiguchi, Machida (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 12/829,253

(22) Filed: Jul. 1, 2010

(65) Prior Publication Data

US 2011/0002353 A1    Jan. 6, 2011

(30) Foreign Application Priority Data

Jul. 3, 2009 (JP) ................................. 2009-159130

(51) Int. Cl.
*H01S 5/00* (2006.01)
(52) U.S. Cl. ............... 372/45.01; 372/46.01; 372/50.12; 372/50.124
(58) Field of Classification Search ............... 372/45.01, 372/46.01, 50.12, 50.124
See application file for complete search history.

(56) References Cited

U.S. PATENT DOCUMENTS

| | | | |
|---|---|---|---|
| 5,493,577 A | | 2/1996 | Choquette et al. |
| 5,949,807 A | * | 9/1999 | Fujimoto et al. ........... 372/45.01 |
| 5,991,321 A | * | 11/1999 | Duggan ..................... 372/45.01 |
| 6,542,528 B1 | * | 4/2003 | Sato et al. .................. 372/45.01 |
| 2005/0135450 A1 | * | 6/2005 | Katsuyama et al. ............ 372/50 |
| 2007/0242717 A1 | * | 10/2007 | Park ........................... 372/50.12 |
| 2008/0089376 A1 | * | 4/2008 | Anan ....................... 372/46.013 |
| 2009/0135874 A1 | * | 5/2009 | Liu ............................ 372/45.01 |

FOREIGN PATENT DOCUMENTS

JP    2004-128482 A    4/2004

* cited by examiner

*Primary Examiner* — Yuanda Zhang

(74) *Attorney, Agent, or Firm* — Canon U.S.A., Inc. IP Division

(57) ABSTRACT

To provide a surface emitting laser having a structure that can suppress the oscillation of a high-order transverse mode. In the surface emitting laser, a plurality of semiconductor layers including a lower DBR, an upper DBR, an active layer interposed therebetween, and a current confinement layer for confining a current injected to the active layer are stacked on a substrate, and a barrier structure limits the migration of a majority carrier, that has passed through a current unconfining portion, in an electric field application direction; the barrier structure is provided between the current confinement layer and the active layer so that an oscillation of a high-order transverse mode is suppressed by the barrier structure promoting the diffusion of the majority carrier in an in-plane direction of the barrier structure.

7 Claims, 6 Drawing Sheets

SURFACE EMITTING LASER, SURFACE EMITTING LASER ARRAY, AND IMAGE FORMATION APPARATUS

BACKGROUND OF THE INVENTION

1. Field of the Invention

The present invention relates to a surface emitting laser, a surface emitting laser array and an image formation apparatus.

2. Description of the Related Art

The vertical cavity surface emitting laser (VCSEL) is a laser that emits a laser light in a direction perpendicular to the in-plane direction of a semiconductor substrate. A surface emitting laser has excellent features such as that it provides a stable single mode as a longitudinal mode, that it has a lower threshold value compared to that of an edge emitting laser, and that it is easy to be formed into a two-dimensional array. Because of those features, there are expectations for surface emitting lasers to be used as a light source for optical communications and optical transmissions, and a light source for electrophotography.

In a surface emitting laser, the control of a transverse mode to be oscillated is a critical issue. Considering applications to communications etc., the transverse mode is required to be a single mode. Therefore, up to now, as disclosed in U.S. Pat. No. 5,493,577, the emitting region of an active layer is limited by providing a current confinement structure within the element through a selective oxidation, and at the same time, a single mode is ensured by forming a waveguide structure with the selectively oxidized portion.

However, a surface emitting laser having a structure as shown by U.S. Pat. No. 5,493,577 has a problem in that a high-order transverse mode becomes more likely to take place as described below. That is, in the surface emitting laser having a current confinement region described in U.S. Pat. No. 5,493,577, the current injected from an electrode disposed around a light emitting portion is confined to a smaller cross-section in a current confining portion as shown in the schematic diagram of FIG. 6A. Because of this, in the active layer as well, the current distribution becomes to have a peak in the vicinity corresponding to the peripheral portion within the current confinement region, as indicated by a solid line in FIG. 6B.

Since, due to such a current distribution, the gain of the active layer increases in the vicinity corresponding to the peripheral portion of the current confinement region as well, the gain of a high-order transverse mode inevitably increases and a high-order transverse mode is strongly excited.

Thus, increasing the injection current to obtain a high optical output power will result in that an oscillation of high-order transverse mode becomes more likely to take place.

SUMMARY OF THE INVENTION

The present invention has been made in view of the above described problem, and has its object to provide a surface emitting laser, a surface emitting laser array, and an image formation apparatus, which have a structure that can suppress the oscillation of a high-order transverse mode.

In order to solve the above described problem, the surface emitting laser comprises: a lower distributed Bragg reflector (DBR) provided on a substrate; an upper DBR provided above the lower DBR; an active layer interposed between the lower DBR and the upper DBR; a current confinement layer for confining a current to be injected to the active layer; and a barrier structure between the current confinement layer and the active layer, the barrier structure limiting the migration of a majority carrier that has passed through a current unconfining portion, in an electric field application direction, and is configured such that an oscillation of a high-order transverse mode is suppressed by the barrier structure promoting the diffusion of the majority carrier in an in-plane direction of the barrier structure.

According to the present invention, in view of the above described problem, it is possible to realize a surface emitting laser, a surface emitting laser array, and an image formation apparatus, which have a structure that can suppress the oscillation of a high-order transverse mode.

Further features of the present invention will become apparent from the following description of exemplary embodiments with reference to the attached drawings.

DESCRIPTION OF THE EMBODIMENTS

Preferred embodiments of the present invention will now be described in detail in accordance with the accompanying drawings.

In the present invention, a plurality of semiconductor layers including, a lower DBR, an upper DBR, an active layer interposed therebetween, and a current confinement layer for confining a current that is injected to the active layer, are stacked on a substrate, and a specific layer is provided between the current confinement structure and the active layer.

Figure 6A:
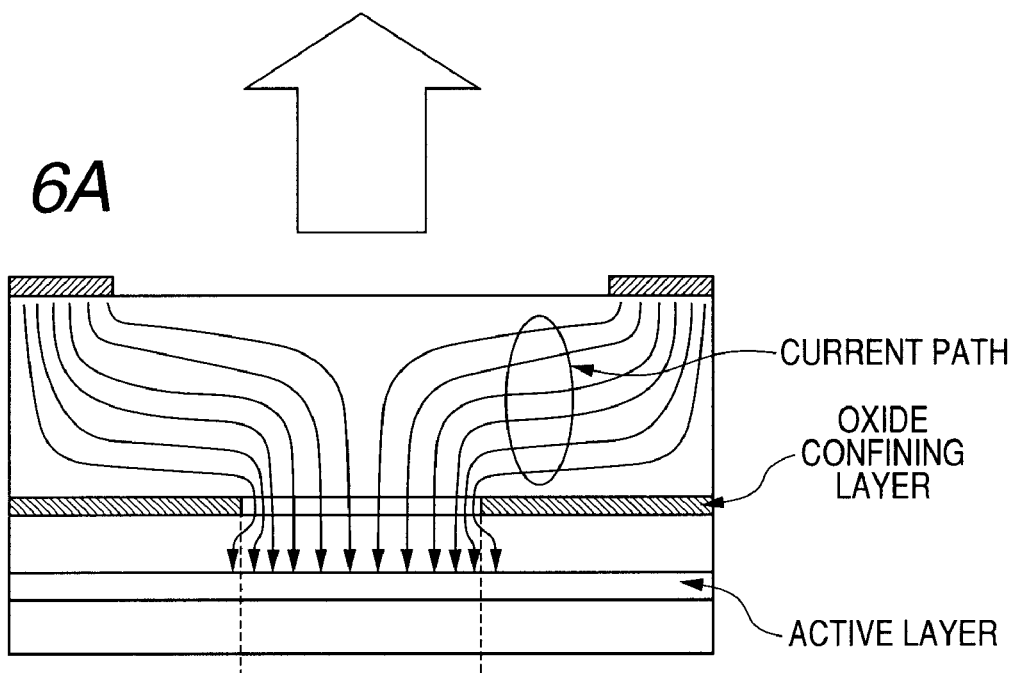
FIG. 6A is a schematic diagram to illustrate the state in which a current is confined to a smaller cross-section in a current confining portion in a surface emitting laser.
Figure 6B:
FIG. 6B is a schematic diagram to describe a peak of current distribution due to the current confinement in the surface emitting laser.

That is, to change the current distribution indicated by a solid line in FIG. 6B into a current distribution of a shape indicated by a dotted line, a specific layer is provided between the current confinement structure and the active layer. Specifically, a barrier structure limiting the migration of a majority carrier that has passed a current unconfining portion, to a current application direction is provided, thereby forming a structure for promoting the diffusion of the majority carrier to the in-plane direction of the barrier structure.

This allows the current distribution in the active layer to be changed from a sharp profile to a gently profile so that the gain for a high-order transverse mode can be decreased. Forming such a structure can suppress a high-order transverse mode, and result in the generation of a sustained single fundamental mode oscillation even when the current injection is increased.

Further, providing the current confinement structure in a P-type region to let the majority carrier be a hole carrier can realize an increase in the in-plane diffusion of the hole carrier having a small mobility by a low barrier structure. This is also effective in suppressing an increase in the driving voltage of a surface emitting laser due to the introduction of the above described barrier structure.

Further, inserting an upper cladding layer between the current confinement layer and the barrier structure, which is close to the active layer, can increase the diffusion of the carrier in the in-plane direction.

Figure 1:
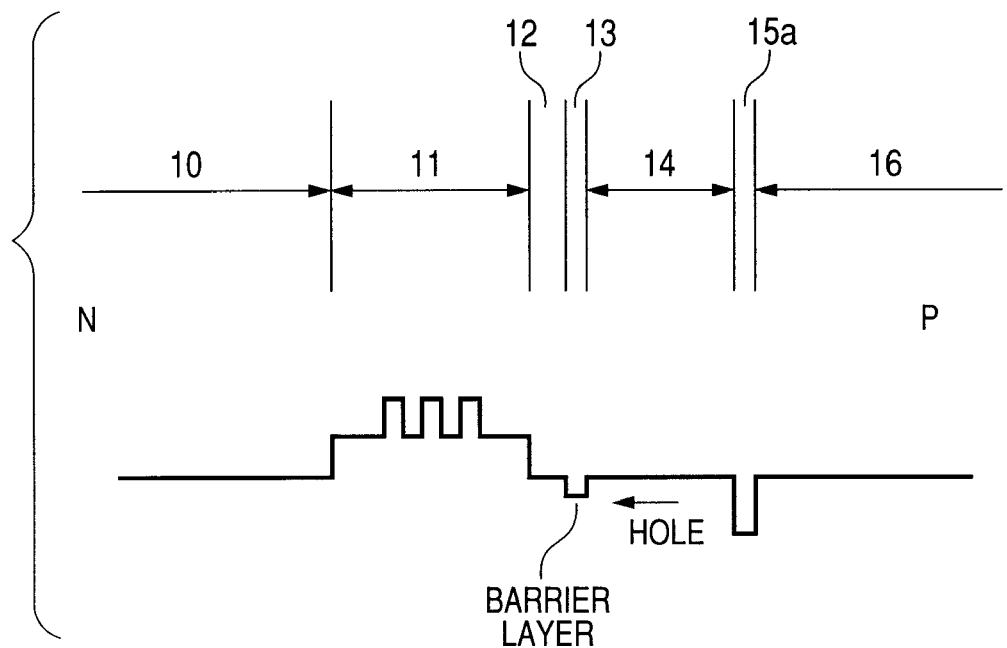
FIG. 1 is a schematic diagram to describe an outline of valence band energy near an active layer in a surface emitting laser of the present invention.

FIG. 1 is a valence band energy diagram in the vicinity of the active layer to illustrate the principle of the present invention according to the above described configuration. A current unconfining portion 15a is surrounded with selectively oxidized region, an upper second cladding layer 14 of the p-side, a p-barrier structure 13 according to the present invention, and an upper first cladding layer 12 of the p-side, are provided on the p-conductivity side of the active layer 11. Then, the diffusion in an in-plane direction of a hole carrier which is the majority carrier injected from the p-side is increased by the p-barrier structure 13.

The peak of the hole carrier of the active layer corresponding to the periphery of the current unconfining portion 15a can be reduced by this configuration.

Further, applying the above described structure of the present invention for promoting the diffusion of the majority carrier, to a structure which controls reflectivity loss of a resonator at a light emitting surface of a fundamental transverse mode and a high-order mode as described in the next example to realize a single mode oscillation, can realize a fundamental transverse mode oscillation further easily. For example, the light emitting surface of the surface emitting laser is configured to have a structure which has different reflectivities at the central portion and the peripheral portion of the light emitting surface.

Thus, since the gain peak of a high-order mode can be suppressed by applying the above described structure of the present invention, the increase of reflectivity loss at the peripheral portion, which is required for the suppression of the high-order mode, is enabled thereby increasing the injection current range of a single-mode oscillation.

Moreover, the suppression of the gain peak of a high-order mode enables the formation of a structure having a decreased current-unconfining diameter while an optical output of the single fundamental transverse mode is maintained, further enabling the reduction of the threshold current and the driving current of the surface emitting laser.

Hereafter, a surface emitting laser in an embodiment of the present invention will be described by using drawings.

Figure 2:
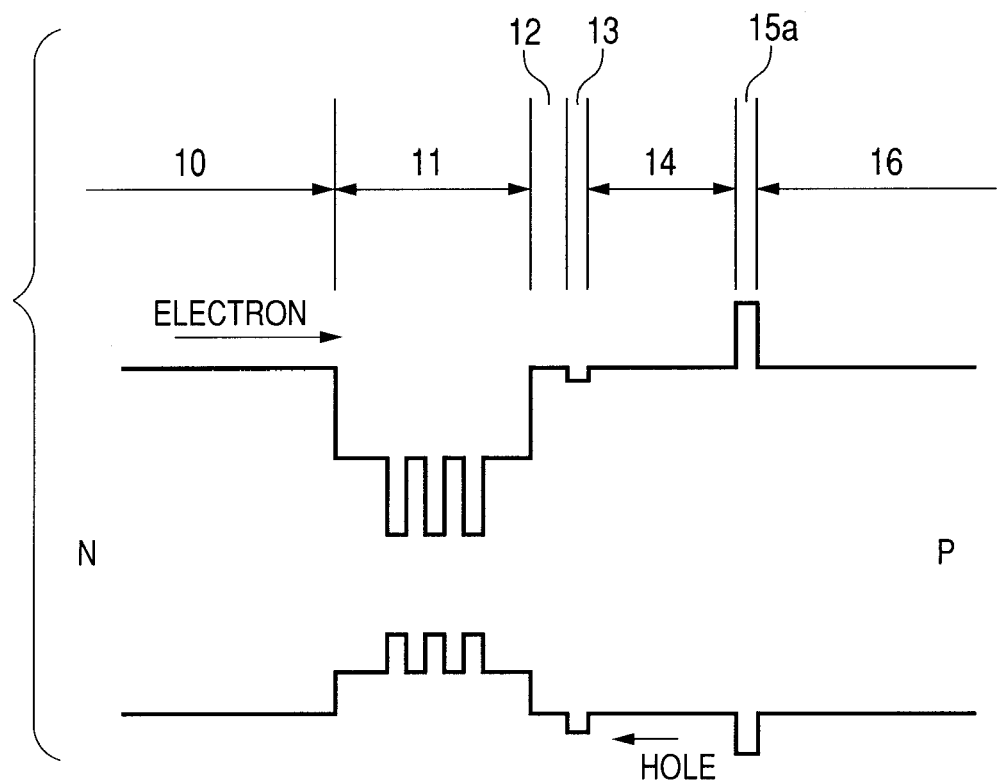
FIG. 2 is a schematic diagram to describe an outline of an energy band in the vicinity of an active layer of a surface emitting laser in an embodiment of the present invention.
Figure 3:
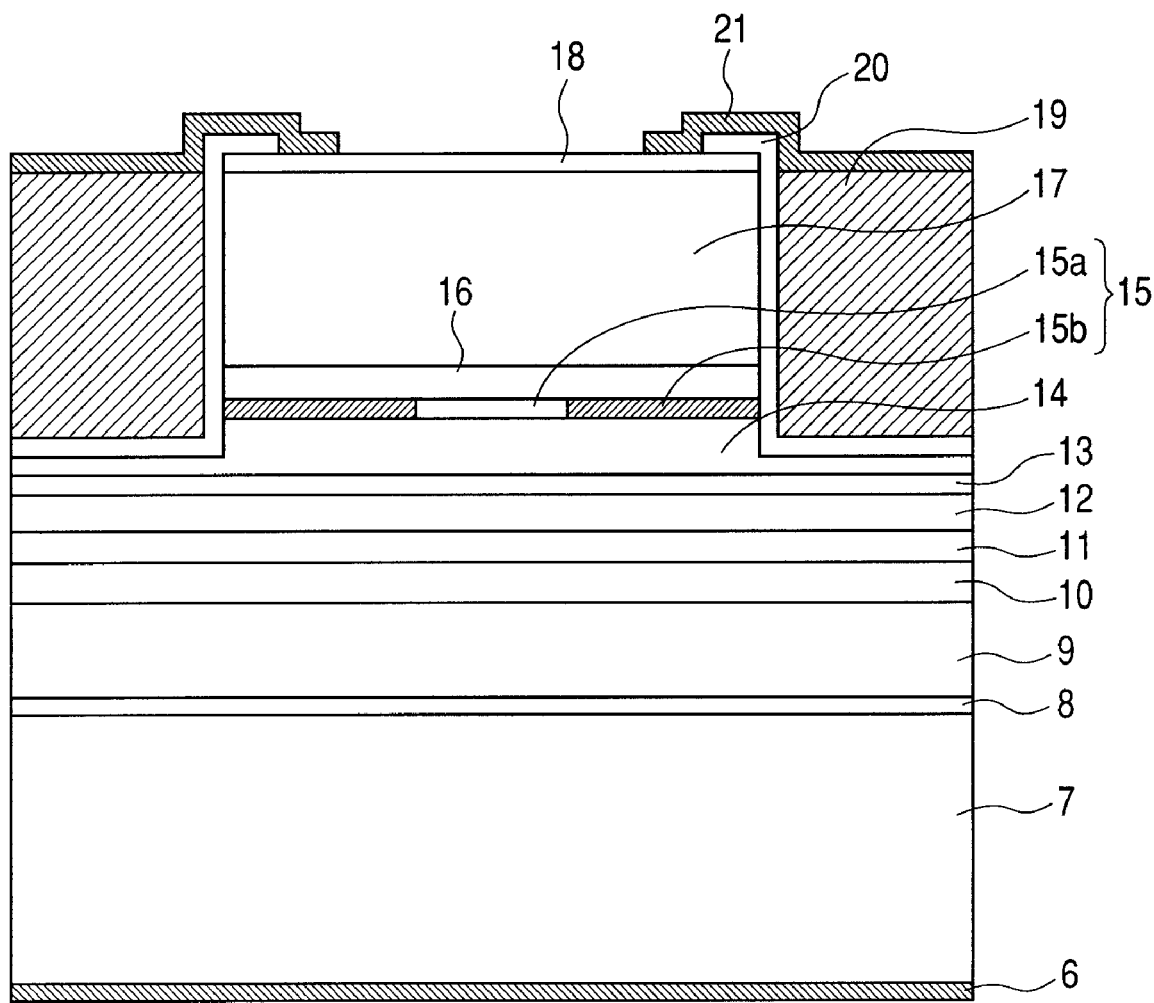
FIG. 3 is a cross-sectional schematic view to describe an outline configuration of the surface emitting laser in the embodiment of the present invention.

In FIGS. 2 and 3, layers having the same functions as those of FIG. 1 are given the same reference symbols.

FIG. 3 shows an n-metal electrode 6, a GaAs substrate 7, an n-GaAs buffer layer 8, an n-side lower DBR 9, and an n-side lower cladding layer 10. Moreover, an active layer 11, a p-side upper first cladding layer 12, a p-barrier structure 13, a p-side upper second cladding layer 14, a current unconfining portion 15a, an oxidized portion 15b are shown. Further, a p-side upper third cladding layer 16, a p-side upper DBR 17, a p-type contact layer 18, an insulation layer 19, a buried layer 20, and a p-metal electrode 21 are shown.

In the surface emitting laser in the present embodiment, a hole carrier injected from the p-metal electrode 21 is confined to a smaller cross-section by the current unconfining portion 15a as shown in the schematic diagram of FIG. 6A. At that moment, since the current density of the peripheral portion of the current unconfining portion 15a significantly increases, the current distribution becomes as indicated by the solid line of FIG. 6B in the active layer 13 as well. Since such a current distribution becomes the gain distribution of the active layer 11, it strongly excites a high-order mode so that an oscillation of a high-order mode becomes more likely to take place.

Inserting the p-barrier structure 13 to the p-side of the active layer 11, as shown in the energy band diagram of the vicinity of the active layer of FIG. 2, increases the diffusion in an in-plane direction, which is perpendicular to the electric field application direction, because the hole carrier is blocked from migrating in an electric field application direction by the p-barrier structure 13.

As a result of this, the peak of the current distribution in the active layer 11 is reduced as indicated by the dotted line of FIG. 6B, the peak of the gain distribution of the active layer 11 is smoothened, and the excitation of a high-order mode is reduced as well.

The effect of the barrier layer on the fundamental mode optical output power of the surface emitting laser in the present embodiment will be described by using FIG. 4.

Figure 4:
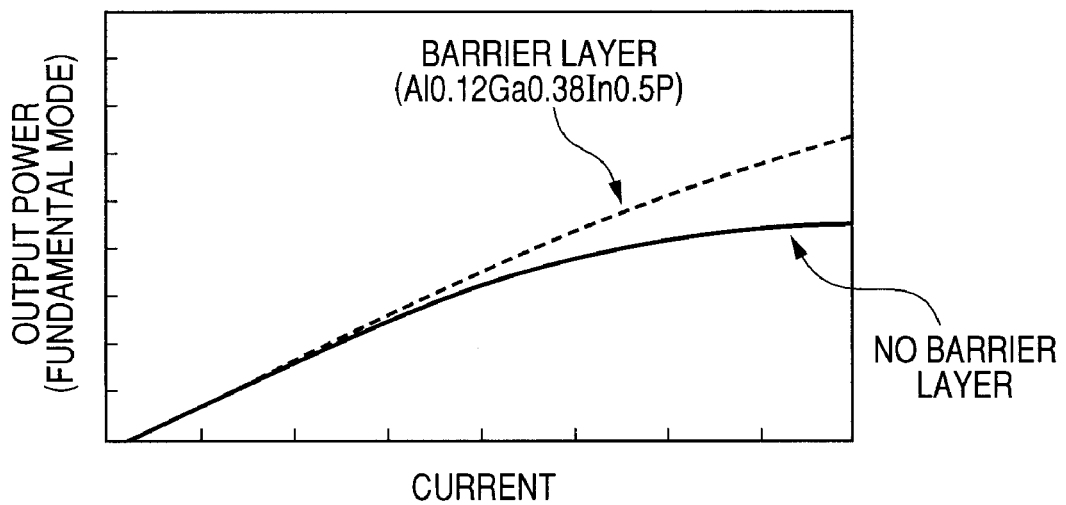
FIG. 4 describes an effect of a barrier structure on a fundamental mode optical output power of the surface emitting laser in the embodiment of the present invention.

FIG. 4 shows a current dependence of the fundamental mode optical output power in the surface emitting laser of the present embodiment when the configuration is made such that the p-side upper second cladding layer 14 is an $Al_{0.6}Ga_{0.4}As$ layer and the p-barrier structure 13 is an $Al_{0.12}Ga_{0.38}In_{0.5}P$. Moreover, the current dependence of the fundamental mode optical output power for a configuration without the p-barrier structure 13 is also shown for reference.

From this figure, it is seen that the insertion of the p-barrier structure 13 has caused the high-order mode optical output power to be suppressed in a region of high injection current, and the fundamental mode optical output power to be increased.

Figure 5:
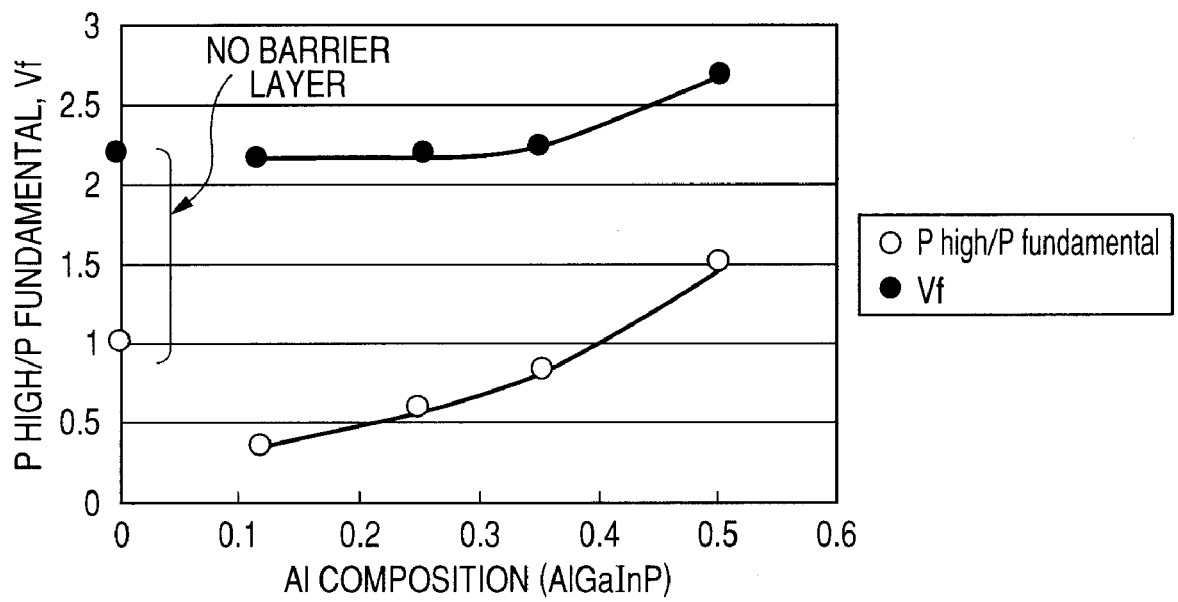
FIG. 5 describes the barrier structure energy height dependence of a fundamental mode/high-order mode ratio, and an element voltage of the surface emitting laser in the embodiment of the present invention.

Referring to FIG. 5, the barrier structure energy height dependence of a fundamental mode/high-order mode ratio and the element voltage of the surface emitting laser in the present embodiment will be described.

FIG. 5 shows the dependence of the ratio of the high-order mode optical output power with respect to the fundamental mode optical output power, and the voltage of the surface emitting laser element on the Al composition of the p-barrier structure 13.

Increasing the Al composition of the p-barrier structure 13 will increase the height of the energy barrier for the hole carrier of the p-barrier structure 13.

In the figure, the element voltage Vf increases at around an Al composition of 0.35, and further the ratio of high-order mode optical output power with respect to fundamental mode optical output power becomes the same level as that of the configuration without the p-barrier structure, at around an Al composition of 0.4.

From this result, it is desirable that the Al composition of the p-barrier structure is not more than 0.35.

Figure 8:
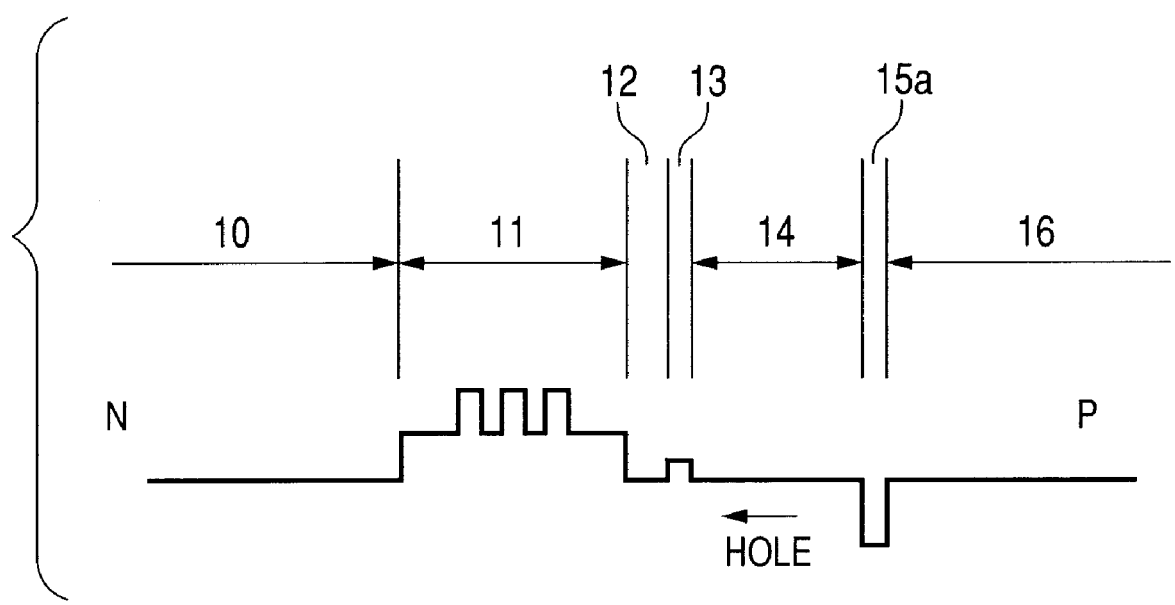
FIG. 8 is a schematic diagram to describe an outline of the valence band energy near an active layer in another form of the surface emitting laser of the embodiment of the present invention.

It is noted that as shown in FIG. 8, the effect of the p-barrier structure 13 can be obtained by a well structure of valence band energy. That is, the same result will be obtained even when the p-barrier structure 13 is made up of a layer having valence band energy higher than that of the upper cladding layer.

This is because the valence band energy of the p-side upper cladding layer acts as a barrier for a hole carrier that has fallen into a well of the valence band energy.

Since the surface emitting laser of the present embodiment as described so far can provide high optical output power in a fundamental transverse mode oscillation, it is suitable for surface emitting laser arrays which are one-dimensionally or two-dimensionally arranged, or as the light source for image formation apparatuses which utilize such a surface emitting laser array as a light source, such as copying machines and printers, etc.

EXAMPLES

The outline manufacturing process of a surface emitting laser in an example of the present invention will be described using FIGS. 7A to 7D.

FIGS. 7A to 7D are for the purpose of describing the outline manufacturing process of the surface emitting laser in the present example, wherein layers having the same function as that of FIG. 1 are given the same reference symbols.

Figure 7A:
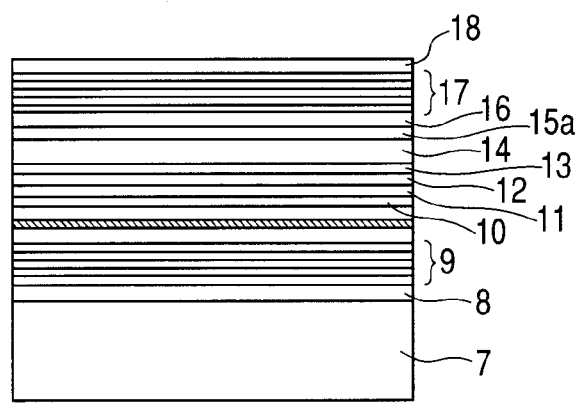
FIGS. 7A, 7B, 7C and 7D describe the manufacturing process of a surface emitting laser in an example of the present invention.

The surface emitting laser in the present example includes a layer configuration as shown in FIG. 7A and these layers are made up by successively growing each layer as described below. That is, an n-type GaAs buffer layer 8, an n-DBR 9, an n-cladding layer 10, and an active layer 11 are grown on an GaAs substrate 7 by a known MOCVD method. Then, further a on the active layer 11, p-first cladding layer 12, a p-barrier structure 13, a p-second cladding layer 14, a current unconfining portion 15$a$, a p-third cladding layer 16, a p-DBR 17, and a p-type contact layer 18 are successively grown.

The n-side lower cladding layer 10 is made up of an n-type $Al_{0.6}Ga_{0.4}As$ layer.

Moreover, the n-side lower DBR is made up of a stack in which $Al_{0.25}Ga_{0.75}As$ and AlAs are alternately stacked by 29 cycles such that the film thickness of each layer is $\lambda/4n_r$. (where, $\lambda$ is the oscillation wavelength of the laser, and $n_r$ is the refractive index of the medium making up the layer).

The active layer 11 is made up of a quantum well layer made of un-doped GaAs, a barrier layer made of un-doped $Al_{0.25}Ga_{0.75}As$, and spacer layers made of un-doped $Al_{0.25}Ga_{0.75}As$ sandwiching those quantum structures.

Moreover, the upper cladding layer is made up of an AlGaAs layer. Specifically, the p-side upper first cladding layer 12, the p-side upper second cladding layer 14, and the p-side upper third cladding layer 16, which are making up the upper cladding layer, are made up of a p-type $Al_{0.6}Ga_{0.4}As$ layer.

Moreover, the barrier structure 13 is made up of an AlGaInP layer, and is in lattice matching with a GaAs substrate. Specifically, the p-barrier structure 13 is made up of a p-type $Al_{0.12}Ga_{0.38}In_{0.5}P$ layer and forms an energy barrier in the valence band between itself and an $Al_{0.6}Ga_{0.4}As$ layer making up the p-first cladding layer and the p-second cladding layer.

On the other had, a well structure of energy is provided on the conduction band side.

The current unconfining portion 15$a$ is made up of an $Al_{0.98}Ga_{0.02}As$ layer, and the oxidized portion 15$b$ is formed by oxidizing an $Al_{0.98}Ga_{0.02}As$ layer.

The p-side upper DBR 17 is a 1 stack in which $Al_{0.25}Ga_{0.75}As$ and AlAs are alternately stacked by 20 cycles such that the film thickness of each layer becomes $\lambda/4n_r$ (where, $\lambda$ is the oscillation wavelength of the laser, and $n_r$ is the refractive index of the medium making up the layer).

The p-contact layer 18 is made up of a GaAs layer with a high carrier density in order to obtain a low-resistance ohmic contact when forming the p-side metal electrode 19.

Figure 7B:
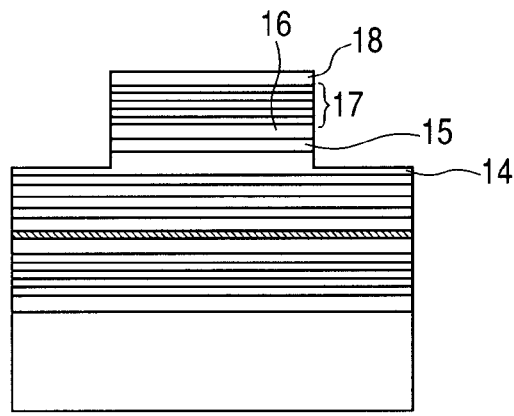

Next, as shown in FIG. 7B, a $SiO_2$ film is deposited on the top surface of the substrate. Then, a resist pattern is formed, and with this pattern as a mask, etching is performed until at least an $Al_{0.98}Ga_{0.02}As$ layer 15 which becomes the current confinement structure is exposed by a known etching technology to form a mesa structure having a diameter of about 30 μm, thereafter removing the resist.

Figure 7C:
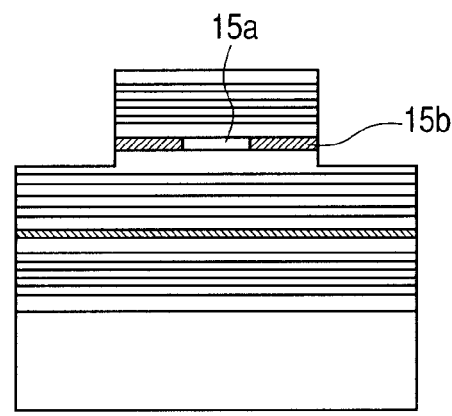

Then, as shown in FIG. 7C, the above described exposed $Al_{0.98}Ga_{0.02}As$ layer is selectively oxidized from the periphery of the mesa structure by a known wet oxidation. As a result of this, a current unconfining portion 15$a$ made up of an $Al_{0.98}Ga_{0.02}As$ layer and an oxidized portion 15$b$ made up of an oxide of $Al_{0.98}Ga_{0.02}As$ are formed and the current unconfining portion 15$a$ serves as a current path to the active layer.

It is noted that the opening portion diameter of the current confining portion formed in the vicinity of the active layer of the surface emitting device is appropriately determined depending on the diameter of the current injection region.

Figure 7D:
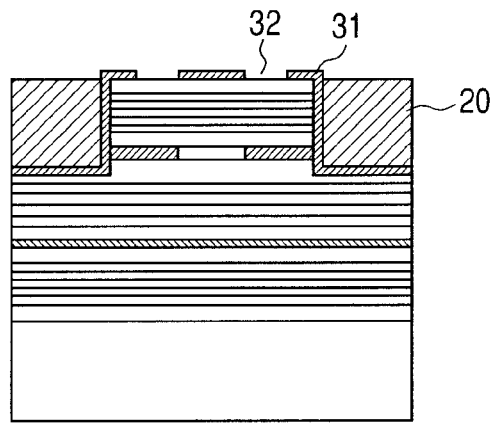

Next, as shown in FIG. 7D, the $SiO_2$ film is removed and a SiN film 31 and a buried insulation layer 20 are deposited all over the surface. Then, a window 32 of an inner diameter of 10 μm and an outer diameter of 15 μm is opened in a ring shape excluding light emitting portion, to successively deposit Ti and Au which form a p-type metal electrode 21, and to continuously form AuGe, Ni, and Au on the GaAs substrate side as an n-type metal electrode 6 thus obtaining the surface emitting laser structure of FIG. 3.

In the surface emitting laser structure in FIG. 3, as a result of electric field being applied between p-n electrodes, the hole carrier injected from the p-type electrode is concentrated in the current unconfining portion, and thereafter the diffusion thereof in the in-plane direction, perpendicular to the electric field application direction, increases at the barrier structure which is present on the way to the active layer. Since this can reduce the peak in the peripheral portion of the carrier distribution in the active layer, a high-order mode oscillation is suppressed and a single mode oscillation can be maintained.

It is noted that although in the above example, an AlGnInP layer which has a valence band energy lower than that of the upper clad layer $Al_{0.6}Ga_{0.4}As$ is used as the barrier structure 13, this is not limiting.

For example, as shown in FIG. 8, an $Al_xGa_{1-x}As$ (0.25<x<0.6), which has a valence band energy higher than that of the upper clad layer $Al_{0.6}Ga_{0.4}As$, may be used as the barrier structure 13.

Forming a well structure in the valence band energy, as above, can increase the diffusion of a hole carrier in the in-plane direction.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2009-159130, filed Jul. 3, 2009, which is hereby incorporated by reference herein in its entirety.

What is claimed is:

1. A surface emitting laser, comprising:
an n-type lower distributed Bragg reflector (DBR) provided on a substrate;
a p-type upper DBR provided above the lower DBR;
an active layer interposed between the lower DBR and the upper DBR;

a current confinement layer for confining a current to be injected to the active layer, wherein the current confinement layer is interposed between the upper DBR and the active layer;

a barrier structure interposed between the current confinement layer and the active layer, the barrier structure limiting the migration of a hole carrier that has passed through a current unconfining portion, in an electric field application direction; and upper cladding layers interposed between the current confinement layer and the active layer, wherein the barrier structure is interposed between the upper cladding layers, and wherein the barrier structure is made of a layer having a valence band energy lower than a valence band energy of the upper cladding layers.

2. The surface emitting laser according to claim 1, wherein each of the upper cladding layers is made of an AlGaAs layer, and the barrier structure is made of an AlGaInP layer, and wherein the barrier structure made of the AlGaInP layer is in lattice matching with a GaAs substrate.

3. The surface emitting laser according to claim 2, wherein the Al composition of the barrier structure made of the AlGaInP layer is not more than 0.35.

4. The surface emitting laser according to claim 1, wherein a light emitting surface of the surface emitting laser has a structure which has different reflectivities at a central portion and a peripheral portion of the light emitting surface.

5. A laser array comprising a plurality of surface emitting lasers, wherein the surface emitting laser according to claim 1 is one-dimensionally or two-dimensionally arranged to form the laser array.

6. An image forming apparatus comprising a light source, wherein the surface emitting laser array according to claim 5 is included in the apparatus as the light source.

7. A surface emitting laser, comprising:

an n-type lower distributed Bragg reflector (DBR) provided on a substrate;

a p-type upper DBR provided above the lower DBR;

an active layer interposed between the lower DBR and the upper DBR;

a current confinement layer for confining a current to be injected to the active layer, wherein the current confinement layer is interposed between the upper DBR and the active layer;

a barrier structure interposed between the current confinement layer and the active layer, the barrier structure limiting the migration of a hole carrier that has passed through a current unconfining portion, in an electric field application direction; and upper cladding layers interposed between the current confinement layer and the active layer, wherein the barrier structure is interposed between the upper cladding layers, wherein the barrier structure is made of a layer having a valence band energy higher than a valence band energy of the upper cladding layer, and wherein each of the upper cladding layers is made of an AlGaAs layer, and the barrier structure is made of an AlGaAs layer having an Al composition less than that of the upper cladding layers.

* * * * *